US011659747B2

(12) United States Patent
Huang

(10) Patent No.: US 11,659,747 B2
(45) Date of Patent: May 23, 2023

(54) DISPLAY APPARATUS INCLUDING AN UNEVEN STRUCTURE, AND METHOD OF MANUFACTURING THE SAME

(71) Applicant: SEEYA OPTRONICS CO., LTD., Shanghai (CN)

(72) Inventor: Zhongshou Huang, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 195 days.

(21) Appl. No.: 17/109,365

(22) Filed: Dec. 2, 2020

(65) Prior Publication Data

US 2021/0335985 A1    Oct. 28, 2021

(30) Foreign Application Priority Data

Apr. 23, 2020 (CN) .......................... 202010327470.4

(51) Int. Cl.
*H01L 27/32* (2006.01)
*H01L 51/50* (2006.01)
*H01L 51/56* (2006.01)

(52) U.S. Cl.
CPC .......... *H10K 59/131* (2023.02); *H10K 50/15* (2023.02); *H10K 50/16* (2023.02); *H10K 59/122* (2023.02); *H10K 71/00* (2023.02)

(58) Field of Classification Search
CPC ............. H01L 27/3276; H01L 27/3246; H01L 51/5056; H01L 51/5072; H01L 51/56
See application file for complete search history.

(56) References Cited

U.S. PATENT DOCUMENTS

| 9,093,404 | B2 | 7/2015 | Yokoyama et al. |
| 10,204,969 | B2 | 2/2019 | Cheng et al. |
| 10,693,068 | B2 | 6/2020 | Lee et al. |
| 10,872,940 | B2 | 12/2020 | Xu |
| 10,886,492 | B2 | 1/2021 | Li et al. |
| 2012/0228592 | A1* | 9/2012 | Yokoyama ........... H10K 71/611 438/46 |
| 2014/0175469 | A1* | 6/2014 | Dozen ................. H01L 27/3246 257/89 |

(Continued)

FOREIGN PATENT DOCUMENTS

| CN | 107104130 | 8/2017 |
| CN | 107742676 | 2/2018 |

(Continued)

OTHER PUBLICATIONS

First Office Action dated Apr. 6, 2022 for Corresponding Chinese Patent Application No. 202010327470.4.

*Primary Examiner* — Peter Bradford
(74) *Attorney, Agent, or Firm* — Duane Morris LLP

(57) ABSTRACT

A display apparatus includes a substrate, a plurality of pixelated first electrodes disposed on the substrate, an uneven surface structure or a porous structure disposed between adjacent pixelated first electrodes, a plurality of OLED lighting elements disposed on the pixelated first electrodes and the uneven surface structure or the porous structure, a second electrode layer disposed on the OLED lighting elements. Equivalent transport distance of carriers along the uneven or porous surface increases accordingly, thereby resulting in reduced lateral leakage current between adjacent pixelated first electrodes.

10 Claims, 5 Drawing Sheets

(56) References Cited

U.S. PATENT DOCUMENTS

| | | | |
|---|---|---|---|
| 2018/0342563 A1 | 11/2018 | You et al. | |
| 2021/0065625 A1* | 3/2021 | Wang | G09G 3/2074 |
| 2021/0193946 A1 | 6/2021 | Zhang et al. | |
| 2022/0005893 A1* | 1/2022 | Liu | H01L 51/56 |

FOREIGN PATENT DOCUMENTS

| | | | |
|---|---|---|---|
| CN | 108493228 | | 9/2018 |
| CN | 109301078 | | 2/2019 |
| CN | 110993678 | | 4/2020 |
| JP | 2002313572 | | 10/2002 |
| JP | 2009283396 | | 12/2009 |
| JP | 2014123528 | | 7/2014 |
| KR | 20180014895 | | 2/2018 |
| KR | 20200132010 | A * | 11/2020 |

\* cited by examiner

DISPLAY APPARATUS INCLUDING AN UNEVEN STRUCTURE, AND METHOD OF MANUFACTURING THE SAME

CROSS-REFERENCE TO RELATED APPLICATION(S)

This application claims priority to Chinese Patent Application No. 202010327470.4 filed Apr. 23, 2020, which is incorporated herein by reference in its entirety.

TECHNICAL FIELD

The present disclosure relates to display technologies and, in particular, to a display apparatus and method of manufacturing the same.

BACKGROUND

In recent years, the organic light-emitting diode (OLED) display screen have gradually become the mainstream of mobile display screen and even taken significant market share in medium to large size display screens. An OLED display apparatus generally includes a plurality of pixels arranged in an array. Each pixel includes a pixel driving circuit and an OLED lighting element electrically connected to the pixel driving circuit.

Each OLED lighting element includes a portion of an organic multilayer sandwiched by a first electrode and a second electrode, where the organic multilayer includes a hole transport layer, a light-emitting layer and an electron transport layer that are stacked in evaporation sequence. In order to increase the display resolution on a fixed size substrate, or to shrink a display dimension while keeping the display resolution, combining a white OLED formed by organic multiple layers with an RGB color filter becomes a viable solution, where the organic multiple layers are continuously deposited onto the OLED substrate without shadow mask and without breaking vacuum. However, due to the high conductivity of the hole transport layer, the lateral leakage current occurs through the hole transport layer whenever a voltage difference between adjacent sub-pixel presents. The lateral leakage current will reduce the signal voltage in each sub-pixel, and result in blurred display image and reduced color gamut in the display image.

SUMMARY

The present disclosure provides a display apparatus and a method of manufacturing the same, aiming to reduce the lateral leakage current between adjacent OLED lighting elements.

In a first aspect, an embodiment of the present disclosure provides a display apparatus, including a substrate, a first electrode layer and a second electrode layer. The display apparatus further includes an organic multilayer including a first-type carrier auxiliary layer, a light-emitting layer and a second-type carrier auxiliary layer.

The substrate includes a matrix of pixel driving circuit, pixel selection means, data writing and reset means, and a plurality of power supply lines.

The first electrode layer including a plurality of pixelated first electrodes is disposed on a surface of the substrate.

The organic multilayer is disposed on the pixelated first electrodes.

The second electrode layer is disposed on the organic multilayer.

The display apparatus further includes a plurality of OLED lighting elements arranged in a matrix on the substrate, and each of the plurality of OLED lighting elements includes a portion of the organic multilayer sandwiched by a pixelated first electrode and the second electrode layer.

The display apparatus further includes an uneven surface structure or a porous structure disposed underneath the first-type carrier auxiliary layer between adjacent OLED lighting elements.

The first-type carrier auxiliary layer may be a hole transport layer and the second-type carrier auxiliary layer may be an electron transport layer. Alternatively the first-type carrier auxiliary layer may be an electron transport layer and the second-type carrier auxiliary layer may be a hole transport layer. The first-type carrier auxiliary layer and the second carrier auxiliary layer may further include carrier injection auxiliary layer and carrier transport auxiliary layer.

In a second aspect, an embodiment of the present disclosure provides a manufacturing method of a display apparatus. The method includes multiple steps in process sequence as described below.

A substrate is provided and includes a matrix of pixel driving circuit, pixel selection means, data writing and reset means, and a plurality of power supply lines.

A first electrode layer is formed and patterned on the substrate, and the first electrode layer includes a plurality of pixelated first electrodes.

An uneven surface structure or a porous structure is formed between adjacent OLED lighting elements.

A first-type carrier auxiliary layer is formed on the pixelated first electrodes and the uneven surface structure or the porous structure.

A light-emitting layer is formed on the first-type carrier auxiliary layer.

A second-type carrier auxiliary layer is formed on the light-emitting layer.

A second electrode layer is formed on the second-type carrier auxiliary layer.

The first-type carrier auxiliary layer may be a hole transport layer and the second-type carrier auxiliary layer may be an electron transport layer. Alternatively the first-type carrier auxiliary layer may be an electron transport layer and the second-type carrier auxiliary layer may be a hole transport layer.

The first-type carrier auxiliary layer and the second carrier auxiliary layer may further include carrier injection auxiliary layer and carrier transport auxiliary layer.

In the display apparatus provided by the embodiments of the present disclosure, the uneven surface structure or the porous structure is disposed underneath the first-type carrier auxiliary layer between adjacent OLED lighting elements. The first-type carrier auxiliary layer is overlaid on the uneven surface structure conformally or filled into the voids in the porous structure, which equivalently increases a transport distance of the first-type carrier in the first-type carrier auxiliary layer and thereby reduces the lateral leakage current between adjacent OLED lighting elements. Image sharpness and color gamut are improved accordingly.

DETAILED DESCRIPTION

Figure 1:
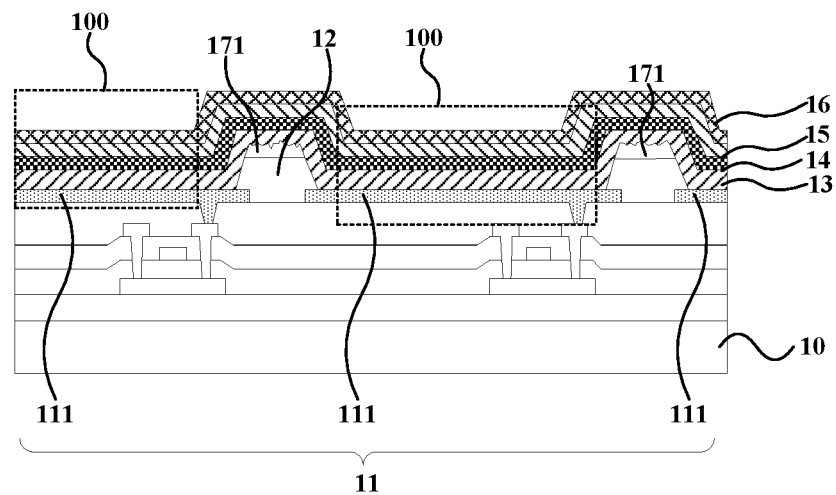
FIG. 1 shows a cross-sectional view of a display apparatus according to embodiments of the present disclosure.

Hereinafter the present disclosure is further described in detail in conjunction with the drawings and embodiments. It is to be understood that the embodiments set forth below are intended to illustrate and not to limit the present disclosure. Additionally, it is to be noted that for ease of description, only part, not all, of the structures related to the present disclosure are illustrated in the drawings.

FIG. 1 shows a cross-sectional view of a display apparatus according to embodiments of the present disclosure, the display apparatus includes a substrate 10, a first electrode layer 11, a first-type carrier auxiliary layer 13, a light-emitting layer 14, a second-type carrier auxiliary layer 15, and a second electrode layer 16.

The first electrode layer 11 is disposed on the substrate 10 and includes a plurality of pixelated first electrodes 111. The first-type carrier auxiliary layer 13 is disposed on the pixelated first electrodes 111. The light-emitting layer 14 is disposed on the first-type carrier auxiliary layer 13. The second-type carrier auxiliary layer 15 is disposed on the light-emitting layer 14. The second electrode layer 16 is disposed on the second-type carrier auxiliary layer 15. The display apparatus further includes a plurality of OLED lighting elements 100 disposed in a matrix on the substrate. Each OLED lighting element 100 includes a portion of an organic multilayer sandwiched by the pixelated first electrodes 111 and the second electrode layer 16, and the organic multilayer includes the first-type carrier auxiliary layer 13, the light-emitting layer 14, and the second-type carrier auxiliary layer 15 that are stacked up in evaporation sequence. An uneven surface structure or a porous structure 171 is disposed underneath the first-type carrier auxiliary layer 13 between adjacent OLED lighting elements 100.

In the embodiments of the present disclosure, the uneven surface structure or the porous structure is disposed underneath the first-type carrier auxiliary layer 13 between adjacent OLED lighting elements 100, and the first-type carrier auxiliary layer 13 will be overlaid on the uneven surface structure conformally or filled into the voids in the porous structure, which equivalently increases transport distance of first-type carrier in the first-type carrier auxiliary layer and thereby reduces the lateral leakage current between adjacent OLED lighting elements. Image sharpness and color gamut are improved accordingly.

The surface roughness in the uneven surface structure is controlled to allow the multiple organic films to run through the uneven surface structure continuously without breaking or cracking, this arrangement will increase the OLED reliability, otherwise which will be compromised by voids or debris caused by discontinued film materials. More specifically, the surface roughness can be characterized by an average amplitude AR in a direction perpendicular to the substrate and an average cycle length GR in parallel to the substrate. It is found through analysis by the inventor that these parameters are preferred to satisfy $0.2D<AR<5D$ and $0.2D<GR<10D$, where D denotes a total thickness including the first-type carrier auxiliary layer, the light-emitting layer, the second-type carrier auxiliary layer, and the second electrode layer.

The average amplitude AR of the surface can be defined and calculated with the following formula:

$$AR = \frac{2}{L}\int_0^L |y - \bar{y}|dx$$

L denotes a surface length in consideration, $\bar{y}$ denotes an average height of the uneven surface structure, and y denotes a height of the uneven surface structure.

The average cycle length GR in parallel to the substrate is defined and calculated by the following formula:

$$GR = \frac{2}{N}\sum_{i=1}^{N} xp_i$$

N denotes the number of sampling points, and $2xp_i$ denotes a horizontal distance between adjacent peaks or protrusions.

Therefore, AR denotes vertical roughness and GR denotes lateral roughness of the uneven surface structure. A comprehensive measure of the surface roughness hereinafter is a ratio between AR and GR. Of course, whether the organic films above the uneven surface structure are continuous depends on the total thickness of the OLED film, other physical properties such as stiffness of the films and deposition process.

Figure 2:
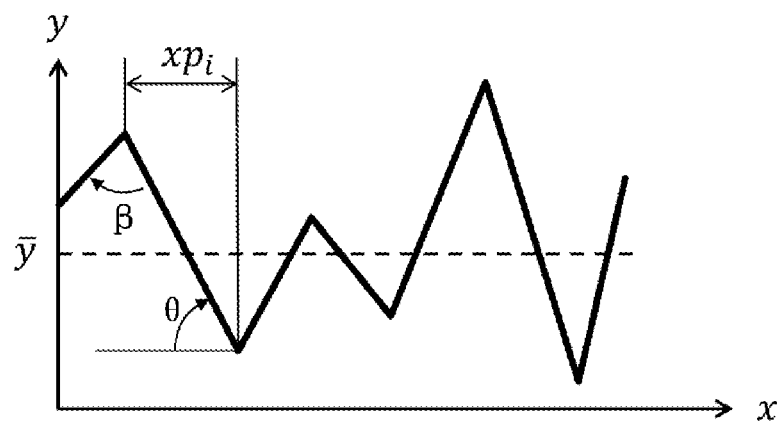
FIG. 2 shows a cross-sectional view of an uneven surface structure according to embodiments of the present disclosure.

Now referring to FIG. 2, two angle parameters θ and β are introduced to characterize the surface roughness. It is found through analysis by the inventor that in order to keep continuation of the thin films on the uneven surface structure, the angle θ should be as smaller as possible, while the angle β should be as larger as possible. For example, making the angle θ smaller than 60°, and making the angle β greater than 60°, the organic films on the uneven surface structure are likely continuous. Now consider the influence of the total thickness D of the OLED film, when AR=5D, the GR should satisfy that GR≥6D, or when AR>D, the GR should satisfy that GR>AR, so as to avoid breaking or cracking in the OLED films on a sharp peak of the uneven surface where film internal stress is easily built up as multiple layers are deposited.

Figure 3:
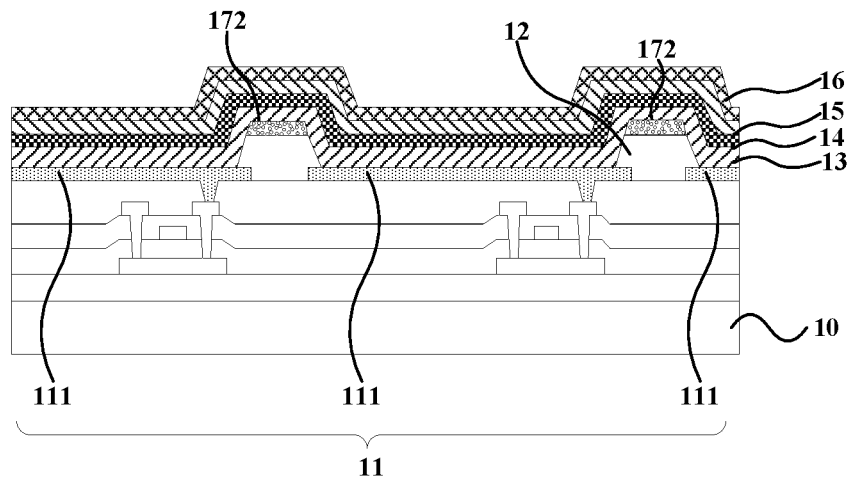
FIG. 3 shows a cross-sectional view of a display apparatus according to another embodiment of the present disclosure.

FIG. 3 shows a cross-sectional view of a display apparatus according to another embodiment of the present disclosure. As shown in FIG. 3, a porous structure 172 is formed underneath the first-type carrier auxiliary layer between adjacent OLED lighting elements, and an averaged void diameter d in the porous structure satisfies that $10\ nm<d<5D$.

With reference to FIGS. 1 and 3, the display apparatus provided by the embodiments of the present disclosure further includes a pixel definition layer 12 disposed between the first-type carrier auxiliary layer 13 and the first electrode layer 11. The pixel definition layer 12 includes an opening structure 121 which is used to expose part of the first electrode 111 and define an effective light-emitting area of the OLED lighting element. The uneven surface structure or the porous structure is disposed between the pixel definition layer 12 and the first-type carrier auxiliary layer 13.

In the embodiments of the present disclosure, the uneven surface structure or the porous structure may be disposed between the pixel definition layer 12 and the first-type carrier auxiliary layer 13. More specifically, after the pixel definition layer 12 is formed, the uneven surface structure 171 is manufactured above the pixel definition layer in FIG. 1, and the porous structure 172 is manufactured above the pixel definition layer in FIG. 3.

In one embodiment, a width of the uneven surface structure or the porous structure disposed on the pixel definition layer is set to be smaller than a width of the pixel definition layer, that is, the vertical projection of the uneven surface structure or the porous structure on the substrate is located within the vertical projection of the pixel definition layer on the substrate, thereby preventing voids or debris caused by the floating uneven surface structure or porous structure at an edge of the pixel definition layer.

In addition, the uneven surface structure needs to have an enough thickness to generate an uneven surface with sufficiently large unevenness. As described above, for example, the unevenness on the surface of the uneven surface structure may be controlled to be greater than 10 nm and smaller than twice the total thickness of the OLED film, for example, smaller than 0.5 microns.

In one embodiment, the vertical projections of the uneven surface structures or the porous structure in the preceding embodiments may be set to be in a grid shape, so that each OLED lighting element is surrounded by the uneven surface structure or the porous structure. This arrangement requires a simplest manufacturing process when the uneven surface structure or the porous structure is etched. In addition, the uneven surface structure or the porous structure may be connected with an external voltage source or float if the uneven surface structure or the porous structure is made of a conductive material. The whole uneven surface structure or porous structure is connected together in the grid shape, which can prevent electrostatic charges from being accumulated in a local region and facilitate the export of electrostatic charges accumulated in the display apparatus due to static electricity, or prevent the electrostatic charge from being accumulated in the local region.

Figure 4:
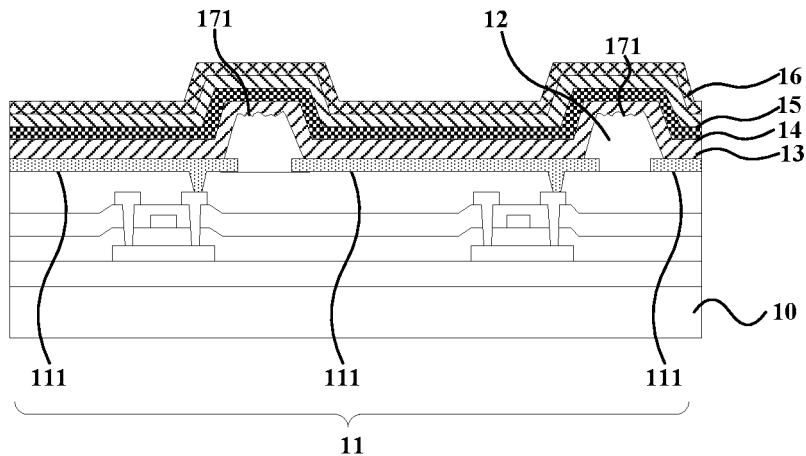
FIG. 4 shows a cross-sectional view of a display apparatus according to another embodiment of the present disclosure.

FIG. 4 shows a cross-sectional view of a display apparatus according to another embodiment of the present disclosure. The structure of the display apparatus of FIG. 4 has certain similarities of the structure of FIG. 3, and differs primarily in that FIG. 4 exemplarily shows that the uneven surface structure 171 is formed underneath the first-type carrier auxiliary layer 13. In the embodiments of the present disclosure, a surface of the pixel definition layer 12 facing away from the substrate 10 may also be processed to form the uneven surface structure or the porous structure.

In one embodiment, if the uneven surface structure or the porous structure is made of the conductive material, a Schottky junction may be formed between the uneven surface structure or the porous structure and the first-type carrier auxiliary layer. By selecting an appropriate material of the uneven surface structure or the porous structure or applying a different potential, a barrier that blocks the movement of the first-type carrier in a direction parallel to the substrate is formed in the first-type carrier auxiliary layer, which further blocks current diffusion between adjacent OLED lighting elements.

The material of the uneven surface structure or the porous structure is not limited in the embodiments of the present disclosure. The arrangement of valleys of the uneven surface structure or voids of the porous structure can increase the transport distance of the first-type carrier in the first-type carrier auxiliary layer and accordingly reduce the lateral leakage current between adjacent OLED lighting elements. Therefore, the uneven surface structure or the porous structure can be made of either the conductive material or an insulating material.

It is to be noted that in the above various embodiments, when the first-type carrier auxiliary layer is the hole transport layer, and the second-type carrier auxiliary layer is the electron transport layer, the first-type carrier auxiliary layer may include at least one of a hole injection layer, a hole transport layer, or an electron blocking layer in a direction away from the substrate, and the second-type carrier auxiliary layer may include at least one of a hole blocking layer, an electron transport layer, or an electron injection layer in the direction away from the substrate. When the first-type carrier auxiliary layer is the electron transport layer, and the second-type carrier auxiliary layer is the hole transport layer, the first-type carrier auxiliary layer may include at least one of the electron injection layer, the electron transport layer, or the hole blocking layer in the direction away from the substrate, and the second-type carrier auxiliary layer may include at least one of the electron blocking layer, the hole transport layer, or the hole injection layer in the direction away from the substrate. The first-type carrier auxiliary layer, the light-emitting layer, and the second-type carrier auxiliary layer may each be made of an organic material.

Figure 5:
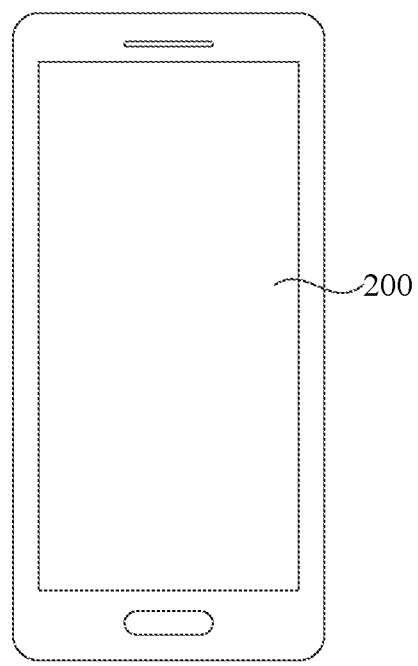
FIG. 5 shows a plane view of a display apparatus according to embodiments of the present disclosure.

An embodiment of the present disclosure further provides a display apparatus. FIG. 5 shows a plane view of a display apparatus according to an embodiment of the present disclosure. The display apparatus may include a mobile phone, a computer, and a smart wearable device (such as a smartwatch), etc., which is not limited in the embodiments of the present disclosure.

Figure 6:
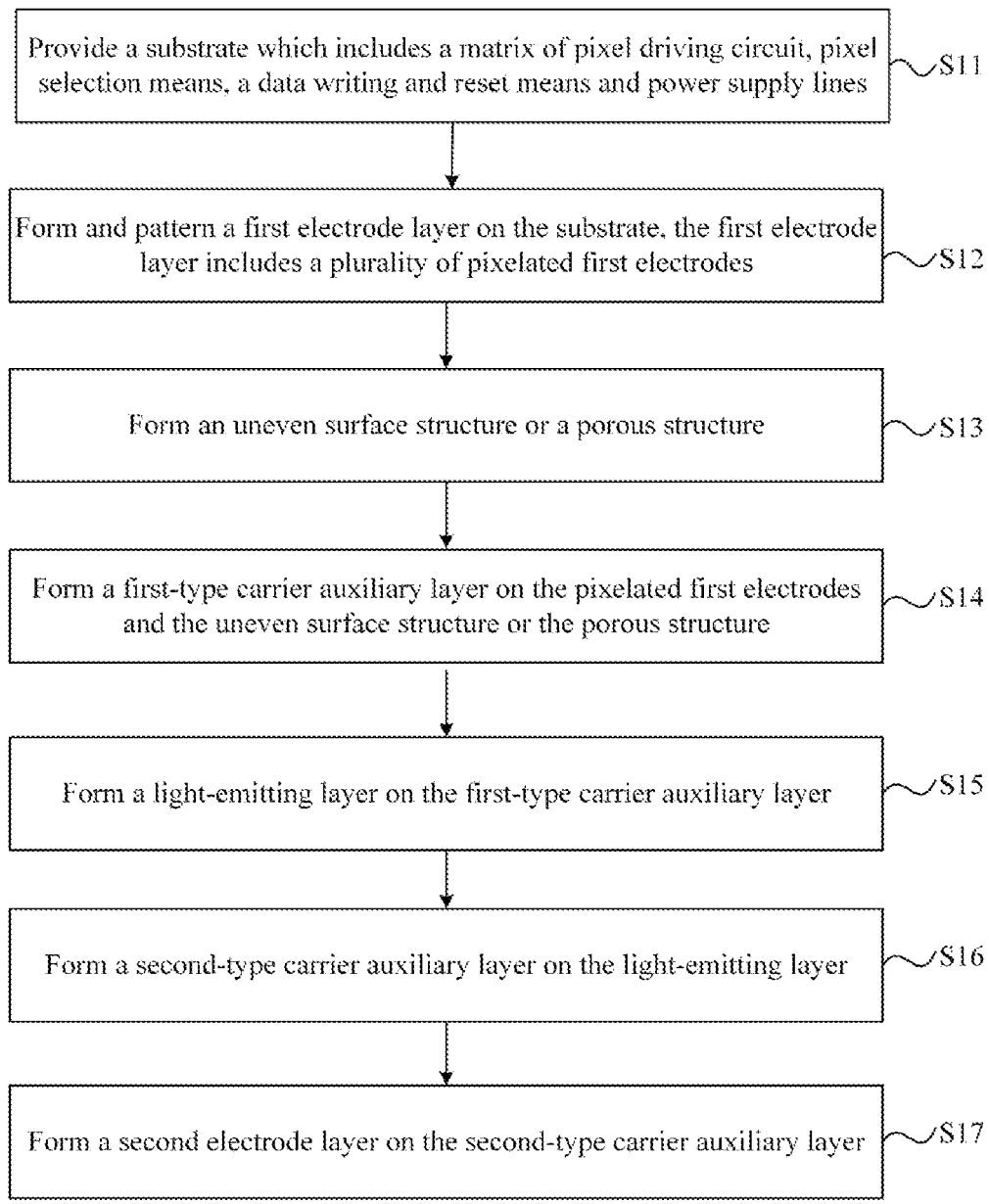
FIG. 6 shows a flowchart illustrating a manufacturing method of a display apparatus according to embodiments of the present disclosure.

An embodiment of the present disclosure further provides a manufacturing method of a display apparatus. FIG. 6 shows a flowchart illustrating a manufacturing method of a display apparatus according to embodiments of the present disclosure. The method includes steps in process sequence as described below.

In S11, a substrate is provided and includes a matrix of pixel driving circuit, a pixel selection means, a data writing and reset means and a plurality of power supply lines.

In S12, a first electrode layer is formed and patterned on the substrate, and the first electrode layer includes a plurality of pixelated first electrodes.

In S13, an uneven surface structure or a porous structure is formed.

In 514, a first-type carrier auxiliary layer is formed on the pixelated first electrodes and the uneven surface structure or the porous structure.

In S15, a light-emitting layer is formed on the first-type carrier auxiliary layer.

In 516, a second-type carrier auxiliary layer is formed on the light-emitting layer.

In 517, a second electrode layer is formed on the second-type carrier auxiliary layer.

The first-type carrier auxiliary layer is a hole transport layer, and the second-type carrier auxiliary layer is an electron transport layer. Alternatively, the first-type carrier auxiliary layer is the electron transport layer, and the second-type carrier auxiliary layer is the hole transport layer. The first-type carrier auxiliary layer and the second carrier auxiliary layer may further include carrier injection auxiliary layer and carrier transport auxiliary layer.

In the embodiment of the present disclosure, the uneven surface structure or the porous structure is disposed underneath the first-type carrier auxiliary layer between adjacent OLED lighting elements, and the first-type carrier auxiliary layer will be overlaid on the uneven surface structure conformally or filled into the voids in the porous structure, which equivalently increases a transport distance of the first-type carrier in the first-type carrier auxiliary layer and thereby reduces the lateral leakage current between the adjacent OLED lighting elements. Image sharpness and color gamut are improved accordingly.

In one embodiment, step S13 includes forming the uneven surface structure or the porous structure through a vapor deposition process during which an inert gas is introduced.

A thin film can be deposited on the surface of a metal material or a non-metal material through the vapor deposition process, the thin film may have a rough surface or a loose structure on the surface and inside the thin film. More specifically, a specific means is to introduce an inert gas with certain pressure, such as argon or nitrogen, into a cavity during the vapor deposition process. The thin film deposited in an environment of high partial gas pressure is no longer dense, but contains a loose structure with through holes inside. The thin film with the loose structure may be a structure of a dense layer covered by a loose layer by introducing the inert gas after a dense film is deposited and then depositing a thin film of the same material. Alternatively, the inert gas is introduced during the deposition of the entire thin film to form the loose structure with through holes. Surface roughness of the uneven surface structure and a diameter of each through hole of the porous structure may be changed by adjusting the pressure of the inert gas introduced into the cavity, for example, the partial pressure of argon ranges from 0.01 Torr to 10 Torr. The vapor deposition process may be, for example, a thermal evaporation or plasma sputtering method. The thermal evaporation method can better generate the porous structure with a loose structure.

Figure 7:
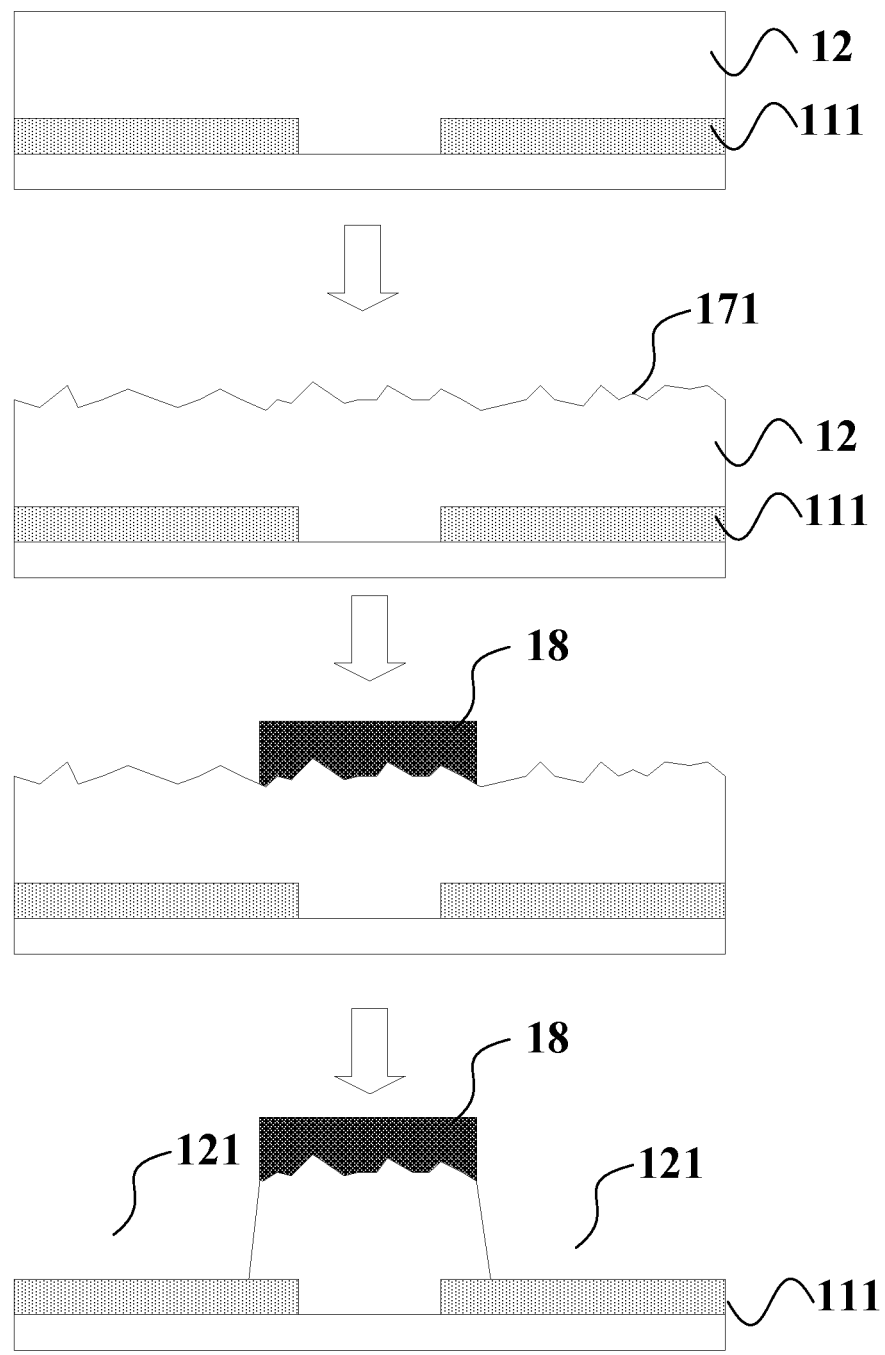
FIG. 7 shows a view illustrating procedures of a manufacturing process of an uneven surface structure or a porous structure according to embodiments of the present disclosure.

In one embodiment, FIG. 7 shows a view illustrating procedures of a manufacturing process of an uneven surface structure or a porous structure according to embodiments of the present disclosure. Step S13 includes steps in process sequence as described below.

In S131, a pixel definition layer is formed.

In S132, the uneven surface structure or the porous structure is disposed on the pixel definition layer.

In S133, a plurality of opening structures is formed on the pixel definition layer, and the opening structure exposes at least part of the first electrode.

In the embodiments of the present disclosure, the pixel definition layer 12 is formed on the pixelated first electrodes 111, the uneven surface structure or the porous structure is formed on the pixel definition layer (FIG. 7 exemplarily shows that the surface of the pixel definition layer 12 facing away from the substrate is processed to form the uneven surface structure 171), a portion of the pixel definition layer without the opening structure 121 is covered by a photoresist 18, the pixel definition layer at positions of the opening structures 121 is etched to expose part of the first electrode 111, and the residual photoresist is finally removed.

In one embodiment, step S132 may include steps described below.

In S1321, a mask is formed.

In S1322, the mask is etched by using a dry etching process to form a porous mask layer.

In S1323, the pixel definition layer is etched through the porous mask layer by using a wet etching process or the dry etching process to form the uneven surface structure underneath the pixel definition layer.

In the wet etching process, an etching liquid will chemically corrodes an exposed surface. A non-uniform chemical corrosion process will generate the rough surface. For example, when a surface of an alloy material is corroded, if a corrosive liquid corrodes one metal in the alloy at a higher rate than the other metal material, an uneven surface will be formed. In the dry etching process, a gas whose ions have a corrosion effect after being ionized and activated, such as $CF_4$, $SF_6$, and other gases in the series, is introduced into a plasma reaction chamber, and mixed with another gas that can oxidize a surface of the material, such as oxygen. The plasma gas will perform reactive ion etch (RIE) on the exposed surface. If this etching process has high power, a high bias voltage, and high gas pressure, a rough etched surface will be formed. Heavier inert gas molecules, such as argon molecules, are added into the plasma gas, and argon ions are driven by a plasma electrical field to bombard a surface of the material without photoresist protection, so that a rough surface morphology can also be formed. In addition, an etching method which alternates the dry etching process with the wet etching process may also be adopted to form the rough surface morphology on an object.

In one embodiment, in the preceding embodiments, in a process of forming the uneven surface structure or the porous structure by using the dry etching process, at least one of a corrosive gas, an oxidizing gas, or the inert gas may be introduced.

The above detailed descriptions of the embodiments of the present invention set forth preferred modes contemplated by the inventor for carrying out the present invention at the time of filing this application, and are provided by way of examples and not as limitations. Accordingly, various modifications and variations obvious to a person of ordinary skill in the art to which it pertains are deemed to lie within the scope and spirit of the present invention as set forth in the following claims.

What is claimed is:

1. A display apparatus, comprising:
a substrate;
a first electrode layer comprising a plurality of pixelated first electrodes and disposed on a surface of the substrate;
an organic multilayer comprising a first-type carrier auxiliary layer, a light-emitting layer and a second-type carrier auxiliary layer and disposed on a surface of the first electrode layer;
a second electrode layer disposed on a surface of the organic multilayer;
a plurality of OLED lighting elements arranged in a matrix on the substrate, each of the plurality of OLED lighting elements comprising a portion of the organic multilayer sandwiched by the pixelated first electrodes and the second electrode layer; and
a rough surface structure including randomly distributed humps and depressions disposed underneath the first-type carrier auxiliary layer between adjacent OLED lighting elements; wherein
in a direction away from the substrate, the first-type carrier auxiliary layer comprises a hole injection layer, a hole transport layer, and an electron blocking layer and the second-type carrier auxiliary layer comprises hole blocking layer, an electron transport layer, and an electron injection layer; or the first-type carrier auxiliary layer comprises a hole blocking layer, an electron transport layer, and an electron injection layer and the second-type carrier auxiliary layer comprises a hole injection layer, a hole transport layer, and an electron blocking layer, a roughness of the rough surface structure is characterized by an average amplitude AR in a direction perpendicular to the substrate and an average cycle length GR in parallel to the substrate, the average amplitude AR and an average cycle length GR satisfy 0.2D<AR<5D, and 0.2D<GR<10D; or satisfy AR>D and GR>AR, and D denotes a total thickness of the first-type carrier auxiliary layer, the light-emitting layer, the second-type carrier auxiliary layer, and the second electrode layer.

2. The display apparatus of claim 1, wherein a vertical projection of the rough surface structure on the substrate are in a mesh shape that each OLED light element is aligned with one opening of the mesh shaped rough surface structure.

3. The display apparatus of claim 1, further comprising a pixel definition layer with an opening structure; wherein
the pixel definition layer is disposed between the first-type carrier auxiliary layer and the first electrode layer, and the opening structure exposes a portion of the first electrode; and
the rough surface structure is disposed between the pixel definition layer and the first-type carrier auxiliary layer.

4. The display apparatus of claim 3, wherein a vertical projection of the rough surface structure is located within a vertical projection of the pixel definition layer on the substrate.

5. The display apparatus of claim 1, wherein
the rough surface structure is made of a conductive material; and
the rough surface structure floats or is electrically connected to a potential input terminal.

6. The display apparatus of claim 1, wherein the rough surface structure is made of an insulating material.

7. A preparation method of a display apparatus, comprising steps in process sequence:
providing a substrate;
forming a first electrode layer on the substrate; wherein the first electrode layer comprises a plurality of pixelated first electrodes;
forming a rough surface structure including randomly distributed humps and depressions;
forming a first-type carrier auxiliary layer on the pixelated first electrodes and the rough surface structure;
forming a light-emitting layer on the first-type carrier auxiliary layer;
forming a second-type carrier auxiliary layer on the light-emitting layer; and
forming a second electrode layer on the second-type carrier auxiliary layer; wherein
in a direction away from the substrate, the first-type carrier auxiliary layer comprises a hole injection layer, a hold transport layer, and an electron blocking layer and the second-type carrier auxiliary layer comprises a hole blocking layer, an electron transport layer, and an electron injection layer; or the first-type carrier auxiliary layer comprises a hole blocking layer, an electron transport layer, and an electron injection layer and the second-type carrier auxiliary layer comprises a hole injection layer, an hole transport layer, and an electron blocking layer, a roughness of the rough surface structure is characterized by an average amplitude AR in a direction perpendicular to the substrate and an average cycle length GR in parallel to the substrate, wherein the average amplitude AR and an average cycle length GR satisfy 0.2D<AR<5D, and 0.2D<GR<10D; or satisfy AR>D, and GR>AR, and D denotes a total thickness of the first-type carrier auxiliary layer, the light-emitting layer, the second-type carrier auxiliary layer, and the second layer.

8. The method of claim 7, wherein forming the rough surface structure comprises:
forming the rough surface structure through a vapor deposition process during which an inert gas is introduced.

9. The method of claim 7, wherein forming the rough surface structure comprises:
forming a pixel definition layer; and
forming the rough surface structure on the pixel definition layer; and
forming a plurality of opening structures on the pixel definition layer; wherein each of the plurality of opening structures exposes at least a portion of the first electrode.

10. The method of claim 7, before forming the rough surface structure, further comprising:
forming a pixel definition layer; wherein forming the rough surface structure comprises:
forming the rough surface structure on the pixel definition layer; wherein
the rough surface structure is formed by using a wet etching process and/or a dry etching process; and
a plurality of opening structures is formed; each of the plurality of opening structures exposes at least a portion of the first electrode.

* * * * *